(12) United States Patent
Aranovsky (10) Patent No.: US 9,097,748 B2
(45) Date of Patent: Aug. 4, 2015

(54) CONTINUOUS CAPACITANCE MEASUREMENT FOR MEMS-ACTUATED MOVEMENT OF AN OPTICAL COMPONENT WITHIN AN AUTO-FOCUS CAMERA MODULE

(71) Applicant: DigitalOptics Corporation, San Jose, CA (US)

(72) Inventor: Anatoly Aranovsky, San Jose, CA (US)

(73) Assignee: DigitalOptics Corporation MEMS, Arcadia, CA (US)

( * ) Notice: Subject to any disclaimer, the term of this patent is extended or adjusted under 35 U.S.C. 154(b) by 31 days.

(21) Appl. No.: 13/947,062

(22) Filed: Jul. 20, 2013

(65) Prior Publication Data

US 2014/0267880 A1 Sep. 18, 2014

Related U.S. Application Data

(60) Provisional application No. 61/786,017, filed on Mar. 14, 2013.

(51) Int. Cl.
| | |
|---|---|
| *G03B 13/00* | (2006.01) |
| *G01R 27/26* | (2006.01) |
| *G02B 7/08* | (2006.01) |
| *G02B 26/08* | (2006.01) |
| *G03B 3/10* | (2006.01) |

(52) U.S. Cl.
CPC .............. *G01R 27/2605* (2013.01); *G02B 7/08* (2013.01); *G02B 26/0833* (2013.01); *G03B 3/10* (2013.01); *G03B 2205/0084* (2013.01)

(58) Field of Classification Search
USPC ........................................ 310/12.03
See application file for complete search history.

(56) References Cited

U.S. PATENT DOCUMENTS

| | | | | |
|---|---|---|---|---|
| 5,786,621 | A * | 7/1998 | Saif et al. ........ | 257/415 |
| 7,697,834 | B1 * | 4/2010 | Tsai ............... | 396/147 |
| 2001/0020850 | A1* | 9/2001 | McIntosh et al. ... | 324/519 |
| 2001/0047689 | A1* | 12/2001 | McIntosh ......... | 73/514.32 |
| 2002/0191897 | A1* | 12/2002 | Hallbjorner et al. | 385/18 |
| 2003/0006125 | A1* | 1/2003 | Hallbjorner ...... | 200/36 |
| 2003/0006783 | A1* | 1/2003 | Min et al. ........ | 324/676 |
| 2005/0077915 | A1* | 4/2005 | Pelz et al. ....... | 324/762 |
| 2008/0106275 | A1* | 5/2008 | Seppa et al. ..... | 324/680 |
| 2010/0001768 | A1* | 1/2010 | Bezooijen et al. .. | 327/108 |
| 2011/0169509 | A1* | 7/2011 | Alini et al. ...... | 324/686 |
| 2012/0153973 | A1* | 6/2012 | Guo .............. | 324/679 |
| 2012/0274141 | A1* | 11/2012 | Shibahara ........ | 307/75 |
| 2013/0001550 | A1* | 1/2013 | Seeger et al. ..... | 257/48 |
| 2013/0075237 | A1* | 3/2013 | Gutierrez ........ | 200/181 |
| 2013/0233077 | A1* | 9/2013 | Chen et al. ....... | 73/514.18 |

\* cited by examiner

*Primary Examiner* — Twyler Haskins
*Assistant Examiner* — Wesley J Chiu
(74) *Attorney, Agent, or Firm* — Haynes and Boone LLP (57) ABSTRACT

A MEMS-actuated autofocus camera module configured for continuous capacitance measurement includes a bridge balance detector coupled to a MEMS actuator driver. The MEMS actuated autofocus camera module is configured to permit online MEMS actuator capacitance measurements to automatically focus images of objects disposed at arbitrary distances from autofocus camera module.

19 Claims, 9 Drawing Sheets

| Compensated Case | | | |
|---|---|---|---|
| C act<br>R act | 40p<br>250 | 140p<br>250 | 240p<br>250 |
| Cmsd | 19 | 121 | 223 |
| d | 21 | 19 | 17 |
| d cent | +2 | 0 | -2 |
| d rel | +.8% | 0 | -.8% |

FIG. 7A

| Under Compensated Case | | | |
|---|---|---|---|
| C act<br>R act | 40p<br>500 | 140p<br>500 | 240p<br>500 |
| Cmsd | 20 | 114 | 186 |
| d | 20 | 26 | 54 |
| d cent | -6 | 0 | +28 |
| d rel | -2.3% | 0 | +11% |

| Over Compensated Case | | | |
|---|---|---|---|
| C act<br>R act | 40p<br>0 | 140p<br>0 | 240p<br>0 |
| Cmdsd | 19 | 129 | >256 |
| d | 21 | 11 | NA |
| d cent | +10 | 0 | NA |
| d rel | +4.0% | 0 | NA |

FIG. 9B

CONTINUOUS CAPACITANCE MEASUREMENT FOR MEMS-ACTUATED MOVEMENT OF AN OPTICAL COMPONENT WITHIN AN AUTO-FOCUS CAMERA MODULE

PRIORITY

This application claims the benefit of priority under 35 U.S.C. §119(e) to U.S. provisional patent application No. 61/786,017, filed Mar. 14, 2013, which is hereby incorporated by reference.

BACKGROUND

In a conventional actuator, a voltage is adjusted to actuate a MEMS and move a component that is coupled to the MEMS. Typically, the power is disconnected when a measurement of the capacitance is made, e.g., in order to track the position of the component. Thus, during a measurement, the voltage is not changed and the MEMS is not actuated. That is, the MEMS is taken offline in order to measure the capacitance.

It is desired to have a technique to measure MEMS actuator capacitance online without disconnecting the power. It is also desired to measure the MEMS actuator capacitance with high resolution (e.g., ~5 fF or ~10 fF or more), and in a manner which is robust to interference and noise.

DETAILED DESCRIPTIONS OF THE EMBODIMENTS

A technique is provided to measure MEMS actuator capacitance online without disconnecting the power. The technique advantageously involves measuring the MEMS actuator capacitance online with high resolution. For example, techniques in accordance with embodiments provides resolutions of around five femtoFarads (~5 fF), or ~10 fF, or ~15 fF, or a range between of 5 fF and 15 fF, or a range around ~10 fF, e.g., between 9 fF and 11 fF, or between 8 fF and 12 fF, or between 7 fF and 13 fF or between 6 fF and 14 fF. The technique provides a significant improvement in resolution in a manner which is robust to interference and noise.

Figure 1:
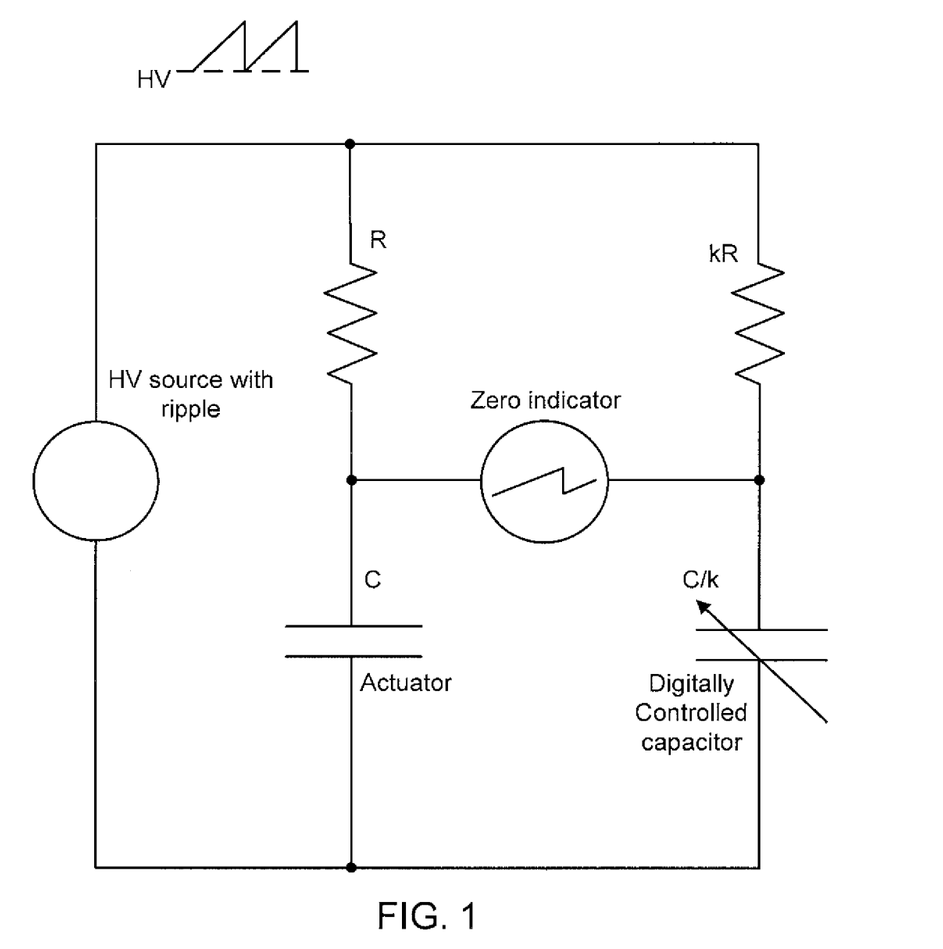
FIG. 1 schematically illustrates a capacitance measurement concept in accordance with certain embodiments.
Figure 2:
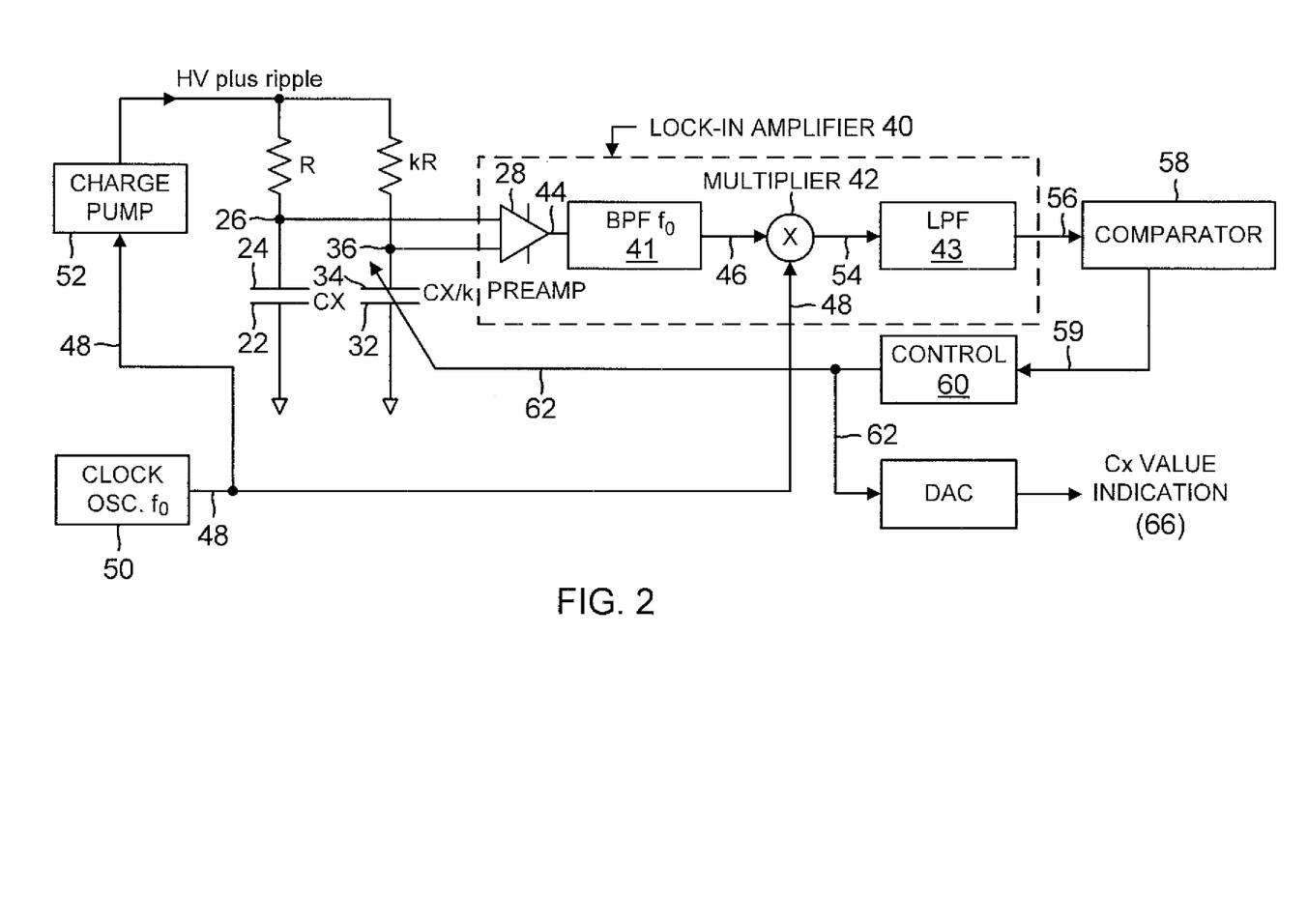
FIG. 2 is a block diagram that illustrates an electrical circuit for capacitance measurement in accordance with certain embodiments.

A continuous capacitance measurement system is provided that in certain embodiments includes a bridge balance detector. A continuous capacitance measurement system is provided that in certain embodiments includes a wheatstone bridge, e.g., with a lock-in amplifier as a bridge balance detector. The wheatstone bridge in accordance with certain embodiments permits on-line continuous capacitance measurements that correspond to the positioning of a movable lens or other optic, e.g., for a MEMS-actuated auto-focus camera module or a MEMS-actuated auto-focus zoom camera module. The lock-in amplifier is able to detect low level signals in the presence of noise and interference. In this way, a capacitance measurement is achieved without disconnecting the power to the MEMS actuator. Referring to FIG. 1 and FIG. 2, advantageously, the variable capacitor $C_{VARIABLE}$ is adjusted to do a measurement of the capacitance of $C_{ACTUATOR}$ without disturbing or adjusting the capacitance of $C_{ACTUATOR}$ nor taking the system offline by disconnecting the MEMS from the power.

A MEMS-actuated autofocus camera module is provided that is configured for continuous capacitance measurement. The camera module includes an image sensor and an optical assembly including at least one movable lens coupled with said image sensor that is configured to automatically focus images of objects disposed at arbitrary distances from the autofocus camera module onto an active image sensor area of the image sensor. A MEMS actuator is coupled to the at least one movable lens and is configured to move the at least one movable lens along an optical path of the camera module and to provide an autofocus range to the camera module. A MEMS actuator driver is electrically coupled to the MEMS actuator and configured to provide specific amounts of electrical power to position the at least one movable lens in accordance with automatically focusing the images of the objects disposed at the arbitrary distances from the autofocus camera module. A bridge balance detector is coupled to the MEMS actuator driver and is configured to permit online MEMS actuator capacitance measurements to automatically focus the images of the objects disposed at the arbitrary distances from the autofocus camera module.

The bridge balance detector may include a wheatstone bridge. A lock-in amplifier may be coupled with the wheatstone bridge. A reference signal generator may be provided a reference signal to the lock-in amplifier. The reference signal generator may include an on chip interference source and/or a charge pump clock.

The bridge balance detector may be configured to measure the capacitance of the MEMS actuator with greater than five femtoFarad (5 fF) resolution or even with greater than ten femtoFarad (10 fF) resolution.

The bridge balance detector may be configured to adjust a variable capacitor around a capacitance of the MEMS actuator to measure the MEMS actuator capacitance without disturbing nor adjusting the MEMS actuator capacitance nor taking an autofocus feature of the camera module offline by disconnecting power to the MEMS.

FIG. 1 schematically illustrates a wheatstone bridge component of a capacitance measurement system for a MEMS actuator coupled to a movable optical component of an auto focus camera module in accordance with certain embodiments. The voltage source may be constant or a periodicity may be added in order that a lock-in amplifier may be used to reduce noisy components of signal that do not have the same periodicity. Alternatively, a periodicity that may be present as a by-product of the voltage source or other constituent of the MEMS auto-focus camera module with which the MEMS actuator is being used to adjust a position of a movable lens group.

A ripple on the indicated voltage source supply line is used in certain embodiments as a bridge excitation signal, e.g., a sharktooth or saw tooth ripple or another periodic ripple or a ripple having a frequency associated with it or derivable from it. A high resolution may be limited by a zero indicator sensitivity, however, the resolution is in the femtoFarad, fF ($10^{-15}$ Farad) range, e.g., in certain embodiments the resolution is approximately ten (10) fF.

The voltage source with ripple illustrated schematically in FIG. 1 is connected in parallel with a series RC component which represents a MEMS actuator component of an auto-focus camera module. The series RC component representing the MEMS actuator is itself connected in parallel with another series RC component having a capacitance $C_{ACTUATOR}/k$ and a resistance $k \cdot R_{ACTUATOR}$. A voltage meter is connected between the positive plates of the two capacitors. The capacitance of $C_{VARIABLE}$ is adjustable, e.g., digitally controllable such that the voltage measured by the voltage meter may be adjusted to be zero, such that $C_{VARIABLE} = C_{ACTUATOR}/k$, and thereby measuring $C_{ACTUATOR}$.

In certain embodiments, a lock-in amplifier is used as a zero indicator. The lock-in amplifier filters out noise and interference that does not have the input periodicity of the voltage source. The lock-in amplifier is robust to voltage supply interference or other on-chip sources of interference. The lock-in amplifier is coupled to the bridge in certain embodiments.

FIG. 2 schematically illustrates a block diagram of a capacitance measurement system in accordance with certain embodiments. The capacitance measurement system illustrated schematically by way of the example circuit of FIG. 2 is particularly configured as a component of a MEMS actuator for an auto-focus camera module, but may be applicable to other movable components and actuators contained within embedded systems or other electronic equipment.

The MEMS actuator capacitor CX is indicated in FIG. 2 as having a ground voltage plate 22 and a positive voltage plate 24. The positive voltage plate 24 of the MEMS actuator capacitor CX is connected to a low voltage contact 26 of a first resistor R and is a first input to a preamplifier 28. The variable capacitor CX/k is indicated in FIG. 2 as having a ground voltage plate 32 and a positive voltage plate 34 that is connected to a low voltage contact 36 of a second resistor kR and is a second input to the preamplifier 28. While in certain embodiments, k>1, other embodiments may have k<1 or k=1.

The preamplifier 28 is an included component in certain embodiments to a lock-in amplifier 40 that also includes a band pass filter (BPF) 41, that is tuned around $f_0$, which may be a selected frequency in certain embodiments, and a multiplier 42, and a low pass filter (LPF) 43. The band pass filter (BPF) 41 receives an output 44 from the preamplifier 28 and provides an output 46 which is received at the multiplier 42 that is tuned around $f_0$.

The multiplier 42 receives an output 46 from the band pass filter (BPF) 41, that is tuned around $f_0$, and a signal 48 from a clock oscillator 50 (tuned around $f_0$). The signal 48 from the clock oscillator 50 is also received as input 48 to a charge pump 52 which provides the voltage source with ripple that powers the MEMS actuator.

An output 54 from the multiplier 42 of the lock-in amplifier 40 is received as input 54 at the low pass filter (LPF) 43. An output 56 from the low pass filter LPF is received as input 56 to a comparator 58. The comparator 58 outputs a signal 59 to a control component 60 which adjusts the capacitance of the variable capacitor CX/k and provides an output signal 62 through a digital to analog converter (DAC) 64 to obtain an indication 66 of a capacitance value of the MEMS actuator capacitor CX. The control component 60 can adjust or select pulse width and/or duration, and/or the start and/or stop positions or locations in time.

The example capacitance measurement circuit of FIG. 2 may be encompassed entirely, or in part, on a single chip, or multiple chips. The MEMS component itself may be separate from the chip or chips that contain the capacitance measurement circuit. The MEMS component itself may be coupled to a movable optical component within a camera module or an optical assembly of a camera module or an optical assembly that is configured for coupling with a camera module or with an image sensor component of a camera module.

Robustness and interference immunity are achieved in certain embodiments, such as the example embodiment of FIG. 2, by using a fully synchronous system that includes a lock-in amplifier 40 with charge pump clock 50 or other on-chip interference source used as a reference signal 48. Continuous capacitance measurement tracking is achieved with high resolution and advantageous absolute accuracy without calibration.

Figure 3:
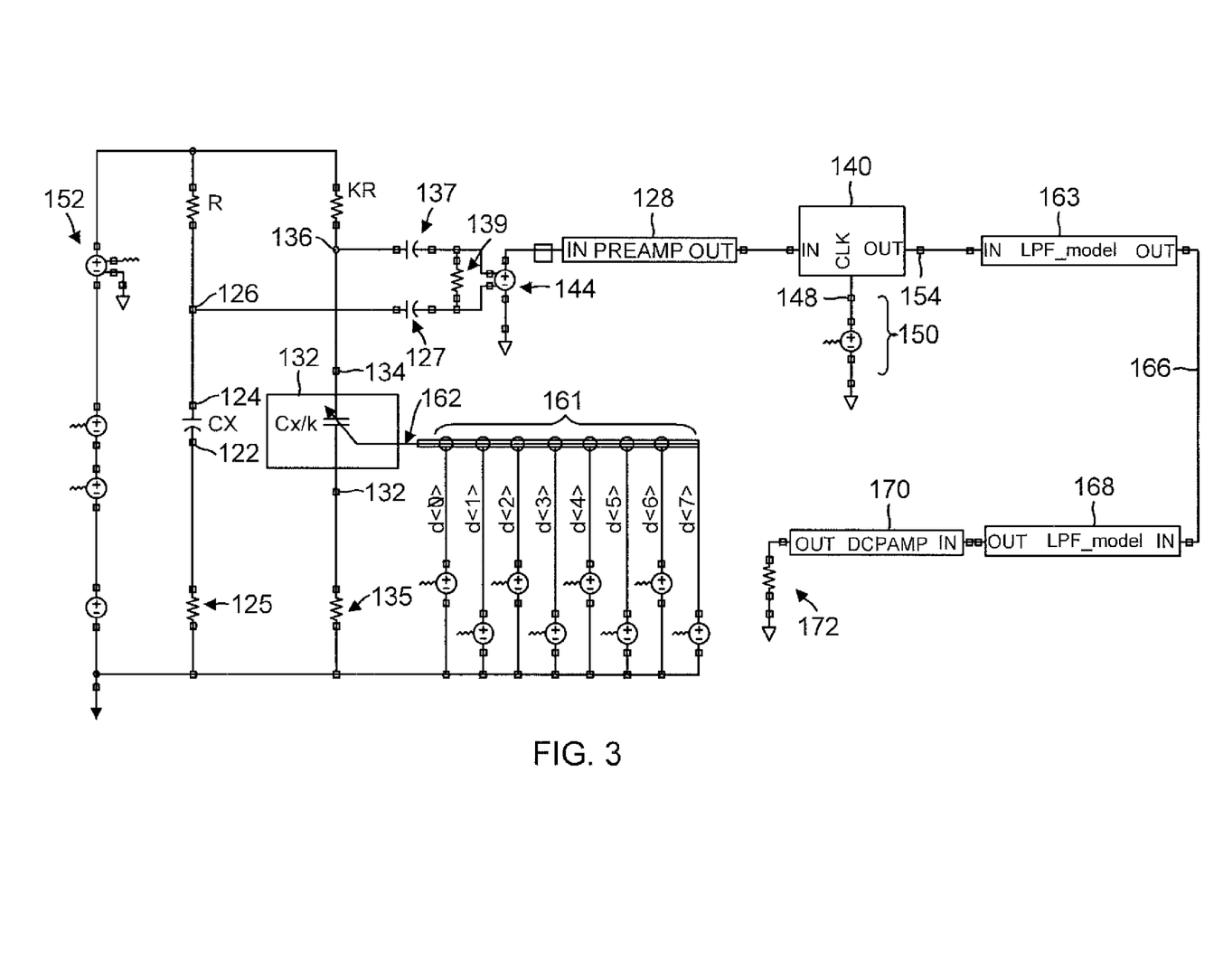
FIG. 3 schematically illustrates an electrical circuit for capacitance measurement in accordance with certain embodiments.

FIG. 3 schematically illustrates a continuous capacitance measurement system in accordance with certain embodiments that may be used for accurate positioning of a movable optic such as a movable lens within an optical assembly of a MEMS-actuated auto-focus or auto-focus zoom camera module in accordance with certain embodiments.

The MEMS actuator capacitor CX is indicated in FIG. 3 as having a positive voltage plate 124 and a low voltage plate 122 that is connected through resistor 125 to ground. The positive voltage plate 124 of the MEMS actuator capacitor CX is connected to a low voltage contact 126 of a first resistor R and is a first input through capacitor 127 to a preamplifier 128. The variable capacitor CX/k is indicated in FIG. 3 as having a positive voltage plate 134 and a low voltage plate 132 that is connected through resistor 135 to ground. The positive voltage plate 134 is connected to a low voltage contact 136 of a second resistor kR and is a second input through capacitor 137 to the preamplifier 128. A resistor 139 is coupled between the low voltage plates of capacitors 127, 137 which are respectively connected to terminals of component 144 which has a low terminal coupled to ground and a high terminal that leads to the preamplifier 128. While in certain embodiments, k>1, other embodiments may have k<1 or k=1.

The preamplifier 128 is an included component in certain embodiments to a lock-in amplifier 140 that also includes a band pass filter. A signal 148 from a clock oscillator 150 (tuned around $f_0$) is received at the lock-in amplifier as a reference signal. The signal 148 from the clock oscillator 50 is also provided to a charge pump 152 which provides the voltage source with ripple that powers the MEMS actuator.

An output 154 is received as input 154 at a low pass filter (LPF) 163. An output 166 from the low pass filter (LPF) 163 is received as input 166 to another low pass filter (LPF) 168 which couples to a high end of a DC Amplifier 170 that has a low end coupled through resistor 172 to ground.

An output signal 162 is provided by a variable capacitance control circuit 161 to adjust a capacitance of the variable capacitor CX/k to obtain an indication of a capacitance value of the MEMS actuator capacitor CX.

The example capacitance measurement circuit of FIG. 3 may be encompassed entirely, or in part, on a single chip, or multiple chips. The MEMS component itself may be separate from the chip or chips that contain the capacitance measurement circuit. The MEMS component itself may be coupled to a movable optical component within a camera module or an optical assembly of a camera module or an optical assembly that is configured for coupling with a camera module or with an image sensor component of a camera module.

Robustness and interference immunity are achieved in certain embodiments, such as the example embodiment of FIG. 3, by using a fully synchronous system that includes a lock-in amplifier 140 with charge pump clock 150 or other on-chip interference source used as a reference signal 148. Continuous capacitance measurement tracking is achieved with high resolution and advantageous absolute accuracy without calibration.

Figure 4:
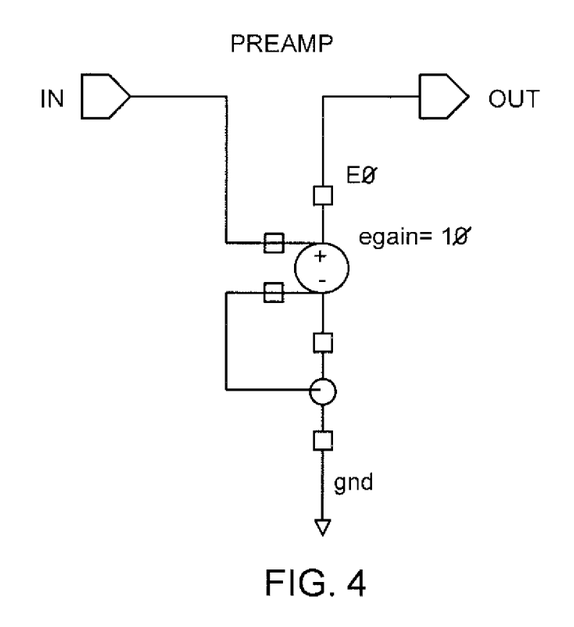
FIG. 4 schematically illustrates an amplifier that may be used with a continuous capacitance measurement system in accordance with certain embodiments.

FIG. 4 schematically illustrates an amplifier that may be used with a continuous capacitance measurement system in accordance with certain embodiments. The amplifier of FIG. 4 may be an example of a preamplifier 28 of FIG. 2, or preamplifier 128 of FIG. 3 or element 170 of FIG. 3 with similar or different gains.

Figure 5:
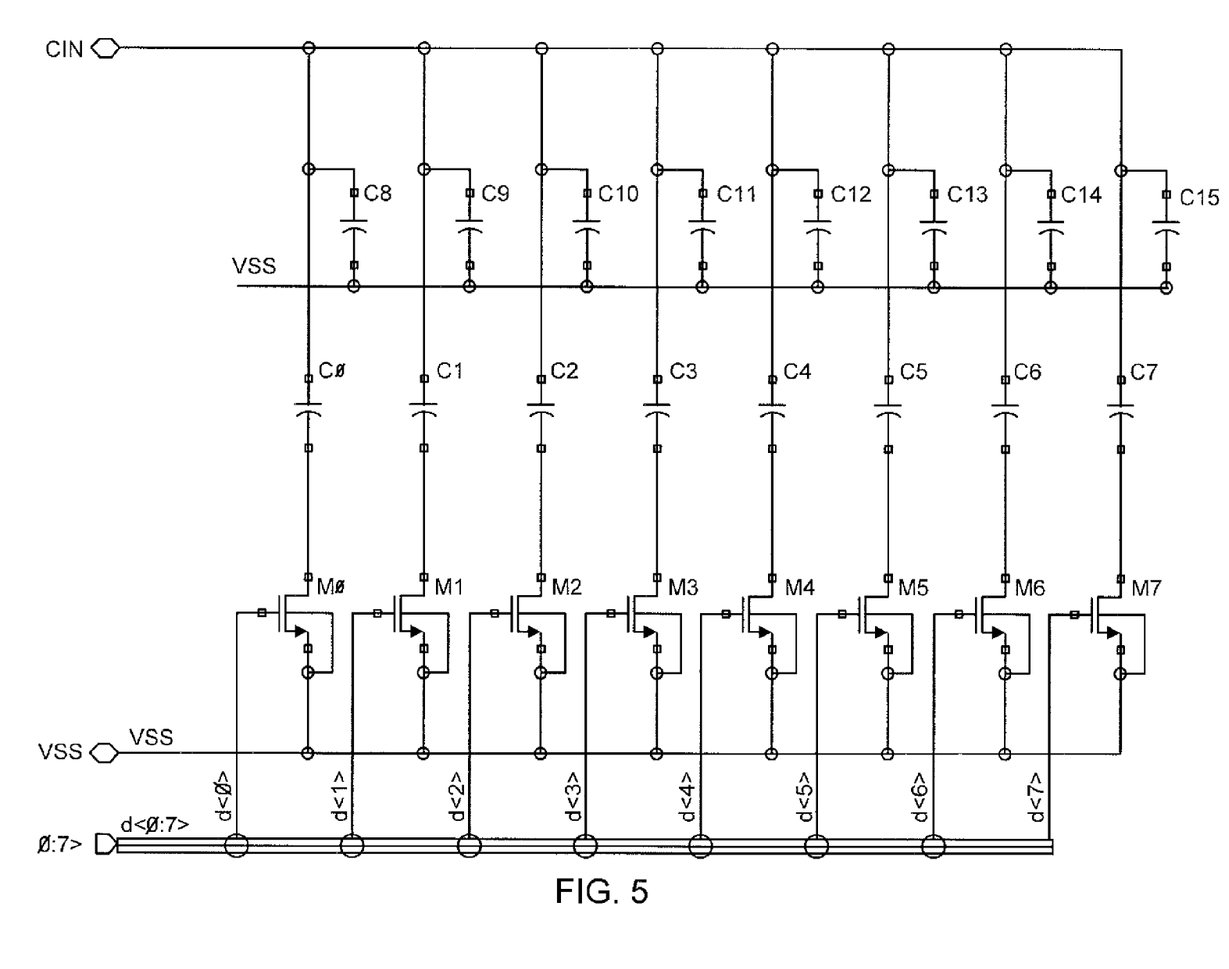
FIG. 5 schematically illustrates a variable capacitance circuit example that may be used with a continuous capacitance measurement system in accordance with certain embodiments.

FIG. 5 schematically illustrates a variable capacitance circuit example that may be used with a continuous capacitance measurement system in accordance with certain embodiments. The variable capacitance circuit may correspond to the variable capacitance control circuit of FIG. 3.

Figure 6A:
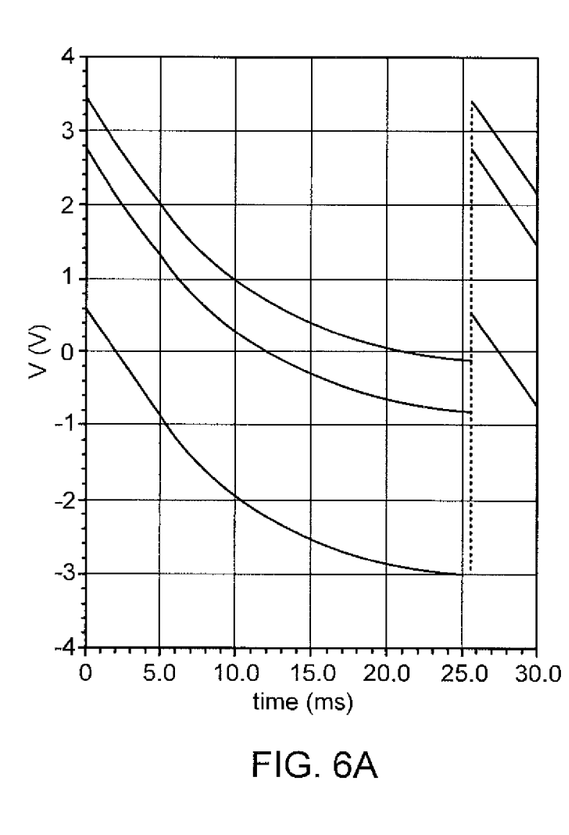
FIGS. 6A-6B illustrate transient responses and show plots of voltage versus time for three low pass filter outputs that correspond to three actual MEMS-actuator capacitance values.
Figure 6B:
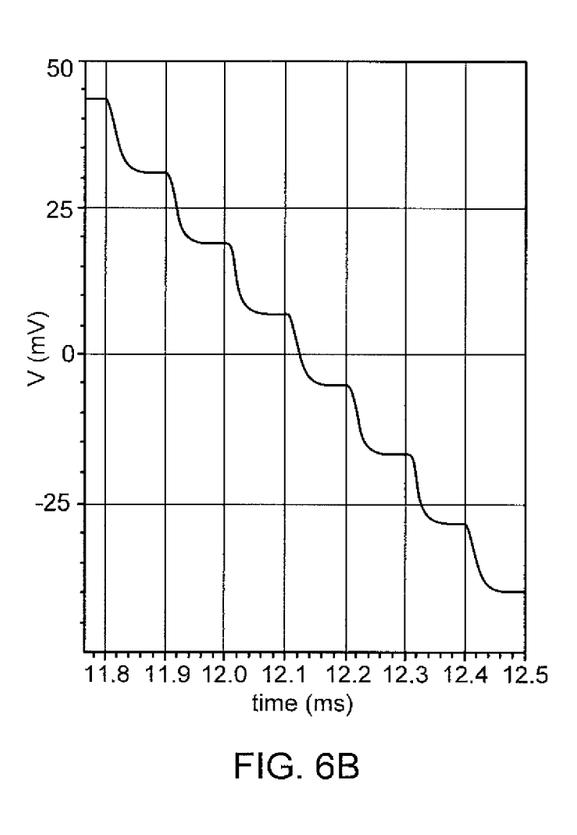

FIGS. 6A-6B illustrate transient responses and show plots of voltage versus time for three low pass filter outputs that correspond to three actual MEMS-actuator capacitance values. In the plots shown in FIG. 6A, those actual capacitance values are 40 pF, 140 pF and 240 pF. FIG. 6B is a very small 100 mV representative range around 0V for the 140 pF plot, illustrating the nature of the 0.1 millisecond steps involved in the example process illustrated by the plots of FIGS. 6A-6B.

The variable capacitance is adjusted during a capacitance measurement in accordance with certain embodiments. The variable capacitance becomes equal to the actual MEMS capacitance, i.e., at a zero crossing when the bridge is balanced. That is when the actual capacitance of the MEMS component is determined from the value of the variable capacitance (and the known value of k).

Figure 7A:
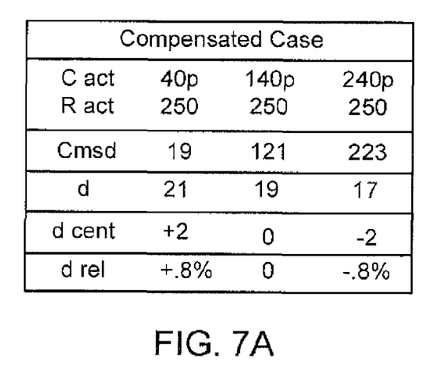
FIGS. 7A-7C illustrate compensatory values for addressing the parasitic resistance of a MEMS actuator in accordance with certain embodiments.
Figure 7B:
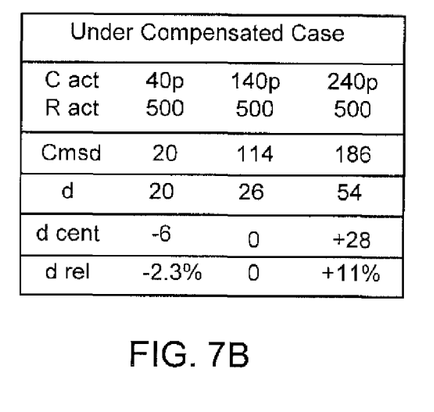
Figure 7C:
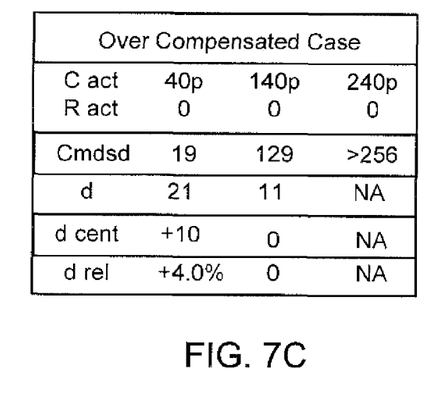

FIGS. 7A-7C illustrate compensatory values for addressing the parasitic resistance of a MEMS actuator in accordance with certain embodiments. The constant value Rcomp is 2.5 k ohms in the example of FIGS. 7A-7C, where Rcomp may correspond to resistor 135 of FIG. 3. The capacitance Cact may correspond to a capacitance CX of the MEMS actuator.

In the examples of FIGS. 7A-7C, the values selected for Cact were 40 pF, 140 pF and 240 pF. The resistance Ract may correspond to the resistance of resistor 125 of FIG. 3. In the compensated case of FIG. 7A, Ract was selected to be 250 ohms for each of the three selected values of Cact. FIGS. 7B-7C illustrate under compensated and over compensated cases, respectively, wherein Ract was set to 500 ohms and 0 ohms. The values Cmsd in the tables of FIGS. 7A-7C may correspond to the capacitances CX/k of FIGS. 2-3 when the bridge is balanced.

In the compensated case, the difference d between the value Cact of FIG. 7A (or CX or FIGS. 2-3) and Cmsd of FIG. 7A (or CX/k of FIGS. 2-3) was 40 pF−19 pF=21 pF, 14-pF−121 pF=19 pF and 240 pF−223 pF=17 pF when Cact was 40 pF, 140 pF and 240 pF, respectively. That is, d in the tables of FIGS. 7A-7C represents a difference between actual and measured values of actuator capacitance, or d=CX−CX/k, when the bridge is balanced. Now "d cent" represents the values of "d" minus the value 19 pF which is the capacitance difference value corresponding to the actuator capacitance value 140 pF which is at the center of the range between 40 pF and 240 pF or coincidentally in this case the average difference value d of those calculated. The values of "d cent" for the actuator capacitances 40 pF, 140 pF and 240 pF, respectively, in the compensated case illustrated by the table of FIG. 7A were in this example +2 pF, 0, and −2 pF. The relative difference "d rel" after subtracting the 19 pF from each the values "d" are provided in FIG. 7A as +0.8%, 0, and −0.8% corresponding respectively to the actuator capacitance values 40 pF, 140 pF and 240 pF.

In the under compensated case, the difference d between the value Cact of FIG. 7B (or CX or FIGS. 2-3) and Cmsd of FIG. 7B (or CX/k of FIGS. 2-3) was 40 pF−20 pF=20 pF, 140 pF−114 pF=26 pF and 240 pF−186 pF=54 pF when Cact was 40 pF, 140 pF and 240 pF, respectively. Now "d cent" represents in FIG. 7B the values of "d" minus the value 26 pF which is the capacitance difference value corresponding to the actuator capacitance value at the center of the range between 40 pF and 240 pF (or the value of d at the actuator capacitance Cact=140 pF). Thus the values of "d cent" in the under compensated case of FIG. 7B were −6 pF, 0 and +28 pF for the actuator capacitances of 40 pF, 140 pF and 240 pF, respectively. The relative difference "d rel" after subtracting the 26 pF from each the values "d" are provided in the table of FIG. 7B as −2.3%, 0, and +11% corresponding respectively to the actuator capacitance values 40 pF, 140 pF and 240 pF.

In the over compensated case, the difference d between the value Cact of FIG. 7C (or CX or FIGS. 2-3) and Cmsd of FIG. 7C (or CX/k of FIGS. 2-3) was 40 pF−19 pF=21 pF, 140 pF−129 pF=11 pF and an undetermined value corresponding to Cmsd being greater than 256 pF, when Cact was 40 pF, 140 pF and 240 pF, respectively. Now "d cent" represents in FIG. 7C the values of "d" minus the value 11 pF which is the capacitance difference value corresponding to the actuator capacitance value at the center of the range between 40 pF and 240 pF (or the value of d at the actuator capacitance Cact=140 pF). Thus the values of "d cent" in the under compensated case of FIG. 7C were +10 pF, 0 and undetermined for the actuator capacitances of 40 pF, 140 pF and 240 pF, respectively. The relative difference "d rel" after subtracting the 11 pF from each the values "d" are provided in the table of FIG. 7C as +4.0%, 0, and undetermined corresponding respectively to the actuator capacitance values 40 pF, 140 pF and 240 pF.

Figure 8A:
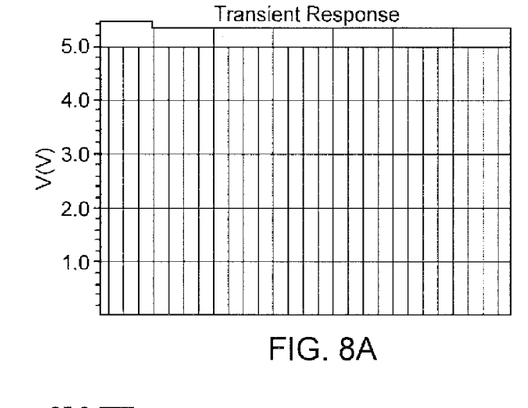
FIGS. 8A-8C illustrate transient responses and show plots of voltage versus time for a MEMS actuator driver in accordance with certain embodiments.
Figure 8B:
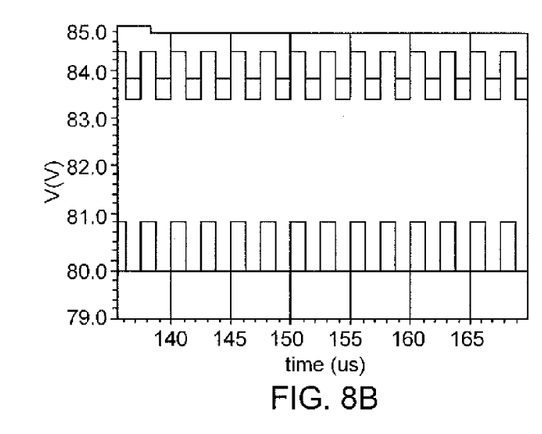
Figure 8C:
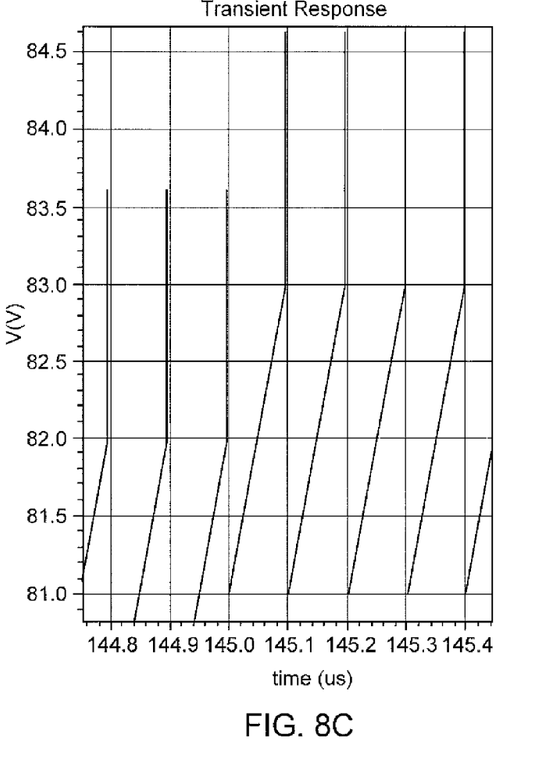

FIGS. 8A-8C illustrate transient responses and show plots of voltage versus time for a MEMS actuator driver in accordance with certain embodiments. In these example, the clock is shown in FIG. 8A, but was not used to produce the voltage source signals. The same signals are shown in FIGS. 8B and 8C that have the frequency of the clock, although the time scales and ranges are quite different.

Figure 9A:
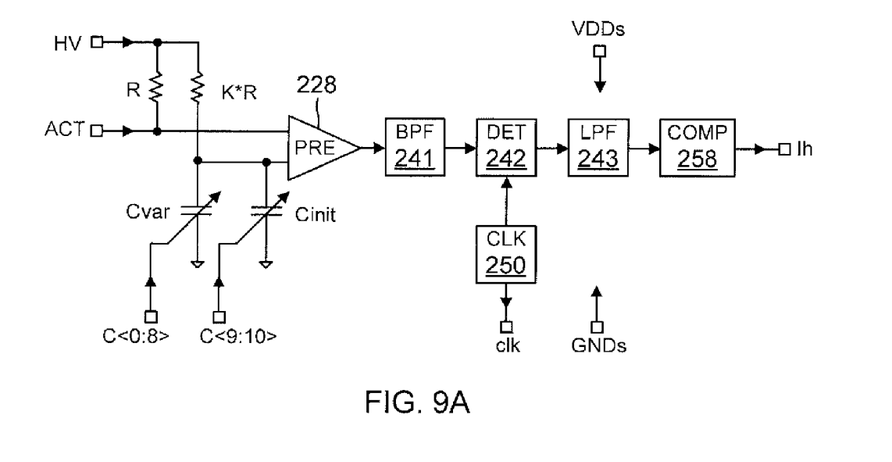
FIG. 9A schematically illustrates a functional block diagram of a continuous capacitance measurement system in accordance with certain embodiments.
Figure 9B:
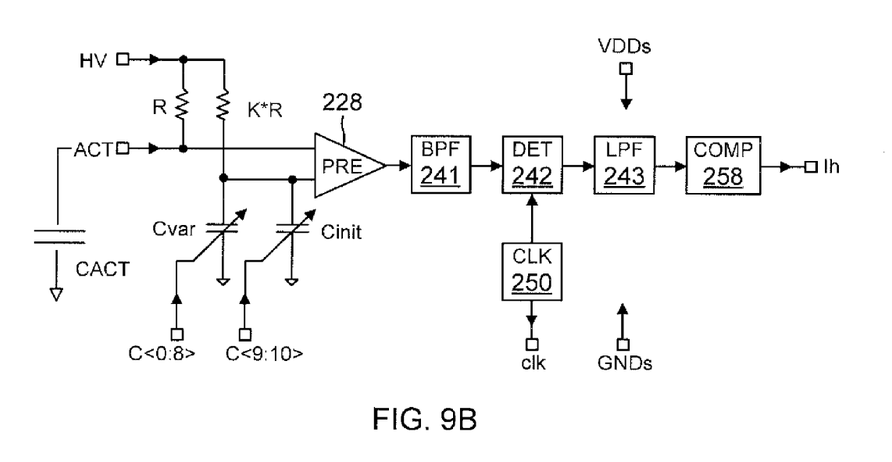
FIG. 9B schematically illustrates a functional block diagram of a continuous capacitance measurement system coupled to a MEMS actuator component in accordance with certain embodiments.

FIG. 9A schematically illustrates a functional block diagram of a continuous capacitance measurement system that may be used for accurate positioning of a movable optic such as a movable lens within an optical assembly of a MEMS-actuated auto-focus or auto-focus zoom camera module in accordance with certain embodiments. The preamplifier 228, band pass filter 241, detector 242, low pass filter 243, clock 250, and comparator 258 may correspond in certain embodiments to preamplifier 28, BPF 41, multiplier 42, LPF 43, clock 50 and comparator 58 of FIG. 2. The system of FIG. 9 can be connected to the MEMS actuator at the ACT block 300 as illustrated in FIG. 9B.

MEMS actuator capacitance may be described by the following equation:

$$C_{act}(\Delta L) = C_{init} + C_{var}(\Delta L)$$

where $C_{act}(\Delta L)$—total actuator capacitance as a function of displacement $\Delta L$ $C_{init}$—initial actuator capacitance. It is a constant value for particular actuator but varies significantly from sample to sample $C_{var}(\Delta L)$—variable capacitance that is a function of displacement $\Delta L$ Capacitance measurement range of the CMB is 25-325 pF with 11 bit resolution (LSB=150 fF) in the example of this embodiment.

Two MSBs are used to compensate for initial actuator capacitance Cinit. These may be programmed at the factory during calibration (for particular actuator) and cover the range from 25 pF to 250 pf with a step of 75 pF and initial offset of 25 pF. Thus, initial capacitance Cinit for particular actuator can be selected to be 25 pF, 100 pF, 175 pF or 250 pF. The remaining 9 bits may be used to measure $C_{var}(\Delta L)$ and cover the range from 0 to 77 pF with a resolution of 150 fF.

Initial capacitance Cinit range, resolution and bit size (of 2 MSBs) do not have to be binary weighted to remaining 9 bits. That is, the offset can be independent.

Capacitance-to-digital conversion is in certain embodiments based on continuous tracking actuator capacitance value. First (on power-up or other command) capacitance value is measured. After that each consecutive measurement increments (or decrements) result of the previous measurement by no more than +/−1 LSB depending on the sign of the capacitance change.

Conversion rate of capacitance measurement block (CMB) may be based on one or more of the following considerations:

Maximum rate of actuator capacitance change is 30 pF per 10 mS. To realize full resolution, we will not allow the actuator capacitance to change between two consecutive measurements by more than 1 LSB:

$$(30 \text{ pf}/10 \text{ ms}) * T\text{sample} \leq 150 \text{ fF or}$$

$$T\text{sample} \leq 50 \text{ uS}$$

FIGS. 9A-9B schematically illustrate functional diagrams in accordance with certain embodiments. Certain theories of operation are provided hereinbelow relating to the circuits shown at FIGS. 9A-9B.

CMB is built in certain embodiments around Wheatstone bridge comprised of R & Cact in one branch and (K*R) & (Cvar+Cinit) in another branch. Variable capacitor Cinit may be preset at the factory and Cvar may be continuously controlled to keep the bridge balanced. When the bridge is in balance:

$$C_{act} = K*(C_{var}+C_{init}) = K*C_{var} + K*C_{init}.$$

In certain embodiments, the coefficient K may be set by design, and capacitor Cinit may be determined during initial factory calibration. Consequently, the value of the Cvar determines (and tracks) the value of Cact in these embodiments.

For normal operation of the bridge in certain embodiments, the voltage 25 shown in FIG. 2 on the HV pin of the charge pump 52 contains an AC component at the frequency of the clk. Referring to FIG. 2, that frequency is $f_0$ and the clock signal is also provided to the lock-in amplifier so that noise and interference are filtered out by discriminating between signals that include the clock frequency and those that do not. The feeding of the clock signal into the HV driver is not specifically shown in the FIGS. 2-3, but examples of HV drivers that may be used in accordance with certain embodiments to drive the MEMS actuator include those described at U.S. patent application Ser. Nos. 13/789,594, 13/789,603 and 13/789,608, and at US published patent application no. 20110169509, which are incorporated by reference. Application circuits such as these may incorporate the capacitance measurement system described herein. Auto-focus camera modules may be described at any of U.S. patent application Ser. Nos. 13/792,148, 13/792,147, 13/792,145, 13/792,140, 13/792,139, 13/792,137 and/or 13/792,132, and/or 61/675,812, 13/445,857, 61/622,480, 13/571,393, and/or 61/657,012, all of which are incorporated by reference.

Example electrical characteristics, such as capacitance measurement parameters, are provided here in accordance a specific example embodiment. Initial offset (intrinsic) may be 25 pF. An offset selection resolution may be 2 bits. An offset selection increment (LSB) may be 75 pF. Selection bits can be defined (by design) independently of the next 9 bits used for measurement. Measurement resolution may be 9 bits. Measurement full scale (FS) may be 77 pF. Measurement LSB may be 0.15 pF. As to DC parameters, an operating voltage may be 1.8V.

While an exemplary drawings and specific embodiments of the present invention have been described and illustrated, it is to be understood that that the scope of the present invention is not to be limited to the particular embodiments discussed. Thus, the embodiments shall be regarded as illustrative rather than restrictive, and it should be understood that variations may be made in those embodiments by workers skilled in the arts without departing from the scope of the present invention.

In addition, in methods that may be performed according to preferred embodiments herein and that may have been described above, the operations have been described in selected typographical sequences. However, the sequences have been selected and so ordered for typographical convenience and are not intended to imply any particular order for performing the operations, except for those where a particular order may be expressly set forth or where those of ordinary skill in the art may deem a particular order to be necessary.

In addition, all references cited above and below herein are incorporated by reference, as well as the background, abstract and brief description of the drawings, and US applications 13/931,978, 13/888,363, 13/789,608, 13/789,603, 13/789,594, 13/726,527, 13/710,430, 13/445,857, 13/571,395, 13/571,405, 13/571,397, 13/571,393, 12/213,472, 12/225,591, 12/289,339, 12/774,486, 13/026,936, 13/026,937, 13/036,938, 13/027,175, 13/027,203, 13/027,219, 13/051,233, 13/163,648, 13/264,251, and 61/698,567 and PCT application WO2007/110097, and U.S. Pat. No. 6,873,358, and RE42,898 are each incorporated by reference into the detailed description of the embodiments as disclosing alternative embodiments.

The following are also incorporated by reference as disclosing alternative embodiments:

U.S. Pat. Nos. 8,055,029, 7,855,737, 7,995,804, 7,970,182, 7,916,897, 8,081,254, 7,620,218, 7,995,855, 7,551,800, 7,515,740, 7,460,695, 7,965,875, 7,403,643, 7,916,971, 7,773,118, 8,055,067, 7,844,076, 7,315,631, 7,792,335, 7,680,342, 7,692,696, 7,599,577, 7,606,417, 7,747,596, 7,506,057, 7,685,341, 7,694,048, 7,715,597, 7,565,030, 7,636,486, 7,639,888, 7,536,036, 7,738,015, 7,590,305, 7,352,394, 7,564,994, 7,315,658, 7,630,006, 7,440,593, 7,317,815, and 7,289,278; and U.S. patent application Ser. Nos. 13/306,568, 13/282,458, 13/234,149, 13/234,146, 13/234,139, 13/220,612, 13/084, 340, 13/078,971, 13/077,936, 13/077,891, 13/035,907, 13/028,203, 13/020,805, 12/959,320, 12/944,701 and 12/944,662; and United States published patent applications nos. 20120199857, 20120019614, 20120019613, 20120008002, 20110216156, 20110205381, 20120007942, 20110141227, 20110002506, 20110102553, 20100329582, 20110007174, 20100321537, 20110141226, 20100141787, 20110081052, 20100066822, 20100026831, 20090303343, 20090238419, 20100272363, 20090189998, 20090189997, 20090190803, 20090179999, 20090167893, 20090179998, 20080309769, 20080266419, 20080220750, 20080219517, 20090196466, 20090123063, 20080112599, 20090080713, 20090080797, 20090080796, 20080219581, 20090115915, 20080309770, 20070296833, and 20070269108.

What is claimed is:

1. A method, comprising:
providing power to a MEMS actuator that is coupled to a movable optic of an autofocus camera module to move the optic to a focus position, wherein the MEMS actuator has a measurable capacitance;
adjusting, while providing the power, a capacitance of a variable capacitor mounted in parallel with the MEMS actuator capacitance;
measuring, while providing the power and while adjusting the capacitance of the variable capacitor, a voltage difference between the MEMS actuator and the variable capacitor; and
measuring, while providing the power, said capacitance of said MEMS actuator based on said voltage difference.

2. The method of claim 1, wherein the measuring of said capacitance of said MEMS actuator comprises measuring with greater than five femtoFarad (5 fF) resolution by determining the capacitance of the variable capacitor at which the voltage difference is substantially zero.

3. The method of claim 2, wherein said measuring of said capacitance comprises filtering interference and noise by measuring said voltage difference using a lock in amplifier.

4. The method of claim 1, wherein the measuring of said capacitance of said MEMS actuator comprises measuring with greater than ten femtoFarad (10 fF) resolution.

5. The method of claim 1, wherein adjusting said variable capacitor comprises adjusting said variable capacitor around a capacitance of said MEMS actuator, and wherein the measuring said capacitance of said MEMS actuator comprises measuring said capacitance without disturbing nor adjusting said MEMS actuator capacitance.

6. One or more non-transitory processor readable media have code embedded therein for programming one or more processors to perform a method, the method comprising:
providing power to a MEMS actuator coupled to a movable optic of an autofocus camera module to move the optic to a focus position, wherein the MEMS actuator has a measurable capacitance;
adjusting, while providing the power, a capacitance of a variable capacitor mounted in parallel with the MEMS actuator capacitance;
measuring, while providing the power and while adjusting the capacitance of the variable capacitor, a voltage difference between the MEMS actuator and the variable capacitor; and
measuring, while providing the power, said capacitance of said MEMS actuator, based on said voltage difference.

7. The one or more non-transitory processor readable media of claim 6, wherein the measuring of said capacitance of said MEMS actuator comprises measuring with greater than five femtoFarad (5 fF) resolution by determining the capacitance of the variable capacitor at which the voltage difference is substantially zero.

8. The one or more non-transitory processor readable media of claim 7, wherein said measuring of said capacitance comprises filtering interference and noise by measuring said voltage difference using a lock in amplifier.

9. The one or more non-transitory processor readable media of claim 6, wherein the measuring of said capacitance of said MEMS actuator comprises measuring with greater than ten femtoFarad (10 fF) resolution.

10. The one or more non-transitory processor readable media of claim 6, wherein adjusting said variable capacitor comprises adjusting said variable capacitor around a capacitance of said MEMS actuator, and wherein measuring said capacitance of said MEMS actuator comprises measuring said capacitance without disturbing nor adjusting said MEMS actuator capacitance.

11. A MEMS-actuated autofocus camera module configured for continuous capacitance measurement, comprising:
an image sensor;
an optical assembly including at least one movable lens coupled with said image sensor and configured to automatically focus images of objects disposed at arbitrary distances from said autofocus camera module onto an active image sensor area of said image sensor;
a MEMS actuator coupled to said at least one movable lens and configured to move said at least one movable lens along an optical path of said camera module and provide an autofocus range to said camera module, wherein the MEMS actuator has a measurable capacitance;
a MEMS actuator driver electrically coupled to said MEMS actuator and configured to provide specific amounts of electrical power to position said at least one movable lens in accordance with automatically focusing said images of said objects disposed at said arbitrary distances from said autofocus camera module; and
a bridge balance detector coupled to said MEMS actuator driver and configured to:
adjust, while the MEMS actuator driver provides the electrical power, a capacitance of a variable capacitor mounted in parallel with the MEMS actuator capacitance;
measure, while the MEMS actuator driver provides the power and while adjusting the capacitance of the variable capacitor, a voltage difference between the MEMS actuator and the variable capacitor; and
measure, while the MEMS actuator driver provides the power, said capacitance of said MEMS actuator based on said voltage difference.

12. The MEMS-actuated autofocus camera module of claim 11, wherein the bridge balance detector comprises a wheatstone bridge.

13. The MEMS-actuated autofocus camera module of claim 12, further comprising a lock-in amplifier coupled with said wheatstone bridge.

14. The MEMS-actuated autofocus camera module of claim 13, further comprising a reference signal generator.

15. The MEMS-actuated autofocus camera module of claim 14, wherein the reference signal generator comprises an on chip interference source.

16. The MEMS-actuated autofocus camera module of claim 14, wherein the reference signal generator comprises a charge pump clock.

17. The MEMS-actuated autofocus camera module of claim 12, wherein the bridge balance detector is configured to measure the capacitance of said MEMS actuator with greater than five femtoFarad (5 fF) resolution.

18. The MEMS-actuated autofocus camera module of claim 12, wherein the bridge balance detector is configured to measure the capacitance of said MEMS actuator with greater than ten femtoFarad (10 fF) resolution.

19. The MEMS-actuated autofocus camera module of claim 12, wherein the bridge balance detector is configured to adjust a variable capacitor around a capacitance of the MEMS actuator to measure said capacitance of said MEMS actuator without disturbing nor adjusting said MEMS actuator capacitance.

* * * * *